United States Patent
Wang et al.

(10) Patent No.: US 11,569,432 B2
(45) Date of Patent: Jan. 31, 2023

(54) SYSTEMS AND METHODS FOR PIEZOELECTRIC, ELECTRONIC, AND PHOTONIC DEVICES WITH DUAL INVERSION LAYERS

(71) Applicant: Georgia Tech Research Corporation, Atlanta, GA (US)

(72) Inventors: Zhong Lin Wang, Atlanta, GA (US); Haiyang Zou, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 130 days.

(21) Appl. No.: 17/098,779

(22) Filed: Nov. 16, 2020

(65) Prior Publication Data
US 2021/0226115 A1    Jul. 22, 2021

Related U.S. Application Data

(60) Provisional application No. 62/936,048, filed on Nov. 15, 2019.

(51) Int. Cl.
| | |
|---|---|
| *H01L 31/0352* | (2006.01) |
| *H01L 41/083* | (2006.01) |
| *H01L 41/047* | (2006.01) |
| *H01L 41/27* | (2013.01) |
| *H01L 31/18* | (2006.01) |
| *H01L 31/0224* | (2006.01) |
| *B82Y 40/00* | (2011.01) |
| *B82Y 30/00* | (2011.01) |

(52) U.S. Cl.
CPC ..... *H01L 41/083* (2013.01); *H01L 31/022466* (2013.01); *H01L 31/035227* (2013.01); *H01L 31/1884* (2013.01); *H01L 41/0471* (2013.01); *H01L 41/27* (2013.01); *B82Y 30/00* (2013.01); *B82Y 40/00* (2013.01)

(58) Field of Classification Search
CPC ........... H01L 41/083; H01L 31/022466; H01L 31/035227; H01L 31/1884; H01L 41/0471; H01L 41/27; B82Y 30/00; B82Y 40/00
See application file for complete search history.

(56) References Cited

U.S. PATENT DOCUMENTS

| | | | | |
|---|---|---|---|---|
| 8,350,251 | B1 * | 1/2013 | Lowgren | H01L 33/18 257/91 |
| 9,728,680 | B2 * | 8/2017 | Dussaigne | H01L 33/24 |
| 10,833,285 | B1 * | 11/2020 | Gruen | H01L 31/0264 |
| 2011/0297913 | A1 * | 12/2011 | Kim | H01L 33/18 438/34 |

(Continued)

*Primary Examiner* — David Vu
*Assistant Examiner* — Brandon C Fox
(74) *Attorney, Agent, or Firm* — Troutman Pepper Hamilton Sanders LLP; Ryan A. Schneider; Sarah M L Wilkening

(57) ABSTRACT

An apparatus comprising a substrate, one or more nanowire pillars, each having a base portion and a tip portion, a first electrode connected to the tip portions of the one or more nanowire pillars, an internal hollow cavity positioned between the substrate and the first electrode, such that at least a portion of each of the one or more nanowire pillars extend through the internal hollow cavity, and a second electrode proximate the first side of the substrate. High-performance broadband photodetectors and other optoelectronics for converting light to electricity with enhanced absorption and carrier collection.

20 Claims, 12 Drawing Sheets

(56) References Cited

U.S. PATENT DOCUMENTS

| | | | |
|---|---|---|---|
| 2011/0303912 A1* | 12/2011 | Cha | B82Y 10/00 977/890 |
| 2015/0303332 A1* | 10/2015 | Chang | H01G 9/2031 438/98 |
| 2016/0204283 A1* | 7/2016 | Patolsky | H01L 31/035227 136/255 |

* cited by examiner

SYSTEMS AND METHODS FOR PIEZOELECTRIC, ELECTRONIC, AND PHOTONIC DEVICES WITH DUAL INVERSION LAYERS

CROSS-REFERENCE TO RELATED APPLICATIONS

This application claims the benefit, under 35 U.S.C. § 119(e), of U.S. Provisional Application Ser. No. 62/936,048, filed on 15 Nov. 2019, which is incorporated herein by reference in its entirety as if fully set forth below.

GOVERNMENT LICENSE RIGHTS

The invention was made with government support under Agreement No. DE-FG02-07ER46394 awarded by the U.S. Department of Energy. The government has certain rights in the invention.

FIELD OF THE DISCLOSURE

Embodiments of the present disclosure relate generally to photonic systems, and more particularly, to broadband photodetectors and methods of making the same.

BACKGROUND

Silicon photonics has been revolutionizing many application areas vital for modern society, including communication systems, computing, biomedical diagnostics, imaging, and sensing. Silicon does, however, have a number of shortcomings as a photonic material. Its indirect energy band and highly reflective surface limit the absorption of light, especially the near-infrared light (NIR) above 900 nm. When the incident optical power increases, the silicon photonic devices will reach a saturation limit and the responsivity falls significantly due to various optical loss mechanisms (such as reflection, heat, incomplete absorption, and indirect bandgap) and recombination of photoinduced carriers. In current photodiodes, doping at high temperature to form a p-n junction is popular, but this process is costly, consumes energy, and requires extra care of cleanliness; furthermore, in highly doped regions, doping-induced crystal damage and/or Auger recombination limit further improvement of light response in these photodiodes. To reduce the front surface reflectance of a planar surface, conventional antireflection coatings with different thicknesses and refractive indices can be effective. Developing nanostructures in the devices can improve the light response by providing longer optical paths, wider acceptance angles, and low surface reflection, but its large effective surface area significantly increases recombination at the device surface. Offering low power consumption while significantly improving responsivity and saturation performance of silicon photonics is critical but challenging.

Responsivity and sensitivity of photonic systems are difficult to improve. Efforts have been made to create devices with longer optical paths, wider acceptance angles, and low surface reflection, but many devices experience increased recombination at the device surface. What is needed, therefore, is high-performance broadband photodetectors and other optoelectronics for converting light to electricity with enhanced sensitivity, responsivity, absorption and carrier collection operating over a wide wavelength range of light from near-ultraviolet to near-infrared at low power consumption. Embodiments of the present disclosure address this need as well as other needs that will become apparent upon reading the description below in conjunction with the drawings.

SUMMARY

The present disclosure relates to an apparatus and methods for making the same. An exemplary embodiment of the present disclosure provides an apparatus comprising a substrate, one or more nanowire pillars, a first electrode, an internal hollow cavity, and a second electrode. The substrate can have a first side and a second side. The one or more pillars can each have a base portion and a tip portion. The base portion of the nanowire pillars can be positioned proximate the second side of the substrate. The tip portion can extend away from the base portion. The first electrode can have a first side connected to the tip portion of the nanowire pillars, and a second side opposite of the first side. The internal hollow cavity can be positioned between the second side of the substrate and the first side of the first electrode, such that at least a portion of each of the nanowire pillars can extend through the internal hollow cavity. The second electrode can be proximate to the first side of the substrate.

In any of the embodiments herein, the one or more nanowire pillars can be oriented substantially perpendicular to the second side of the substrate. The one or more nanowire pillars can comprise one of an n-type semiconductor material or a p-type semiconductor material.

In some embodiments, the substrate can comprise the other of the n-type semiconductor material or the p-type semiconductor material. In some embodiments, the substrate can comprise the same n-type semiconductor material or p-type semiconductor material as the one or more nanowire pillars.

In any of the embodiments herein, the p-type semiconductor material can be selected from the group consisting of silicon, boron, gallium, zinc sulfide, copper sulfide, tin (II) sulfide, zinc phosphide, copper tin sulfide, and combinations thereof. The n-type material can be selected from the group consisting of zinc oxide, zinc tin oxide, zinc selenide, zinc sulfide, tin oxide, tin dioxide, gallium phosphide, cadmium selenide, cadmium arsenide, titanium dioxide, copper (II) oxide, zirconate titanate, barium titanate, lead titanate, lead niobate, lithium tantalite, potassium niobate, sodium tungstate, and combinations thereof.

In some embodiments, the apparatus can further comprise a dielectric layer. The dielectric layer can be disposed between the second side of the substrate and the base portions of the one or more nanowire pillars. In some embodiments, at least a portion of the second side of the substrate can be covered with the dielectric layer. The dielectric layer can comprise a metal oxide or nitride selected from the group consisting of titanium dioxide, zirconium dioxide, tin oxide, tin dioxide, aluminum oxide, alumina, silicon dioxide, zinc oxide, indium oxide, hafnium oxide, titanium nitride, aluminum nitride, silicon nitride, hafnium nitride, zirconium nitride, tantalum nitride and combinations thereof.

In some embodiments, the first electrode can comprise a transparent material. The transparent material can be configured to allow light to pass from the second side of the first electrode, through the first electrode, and into the internal hollow cavity. The transparent material can be selected from the group consisting of indium tin oxide, fluorine tin oxide, indium zinc oxide, aluminum zinc oxide, indium cadmium oxide, barium stannate, strontium vanadate, calcium vanadate, poly(3,4-ethylenedioxythiophene), poly(styrene sulfonate), poly(4,4-dioctyl cyclopentadithiophene), thin-film silver, thin-film gold, and combinations thereof.

In some embodiments, the second surface of the first electrode can be non-planar.

In some embodiments, the second electrode can be a metal. The metal selected from the group consisting of lithium, beryllium, sodium, magnesium, aluminum, potassium, calcium, scandium, titanium, vanadium, chromium, manganese, iron, cobalt, nickel, copper, zinc, gallium, rubidium, strontium, yttrium, zirconium, niobium, molybdenum, technetium, ruthenium, rhodium, palladium, silver, cadmium, indium, tin, cesium, barium, lanthanum, cerium, hafnium, tantalum, tungsten, rhenium, osmium, iridium, platinum, gold, mercury, thallium, lead, bismuth, and combinations thereof.

In some embodiments, the apparatus can further comprise a seed layer. In any of the embodiments, the seed layer can be the same material as the nanowire pillars. The seed layer can have a first side and a second side. The first side of the seed layer can be positioned proximate the second side of the substrate. The second side of the seed layer can be positioned proximate the base portions of the nanowire pillars.

In some embodiments, the first electrode can be in electrical communication with the second electrode via at least the one or more nanowire pillars.

Some embodiments of the present disclosure provide a method of producing an apparatus. The method can comprise providing a substrate, depositing a seed layer, growing one or more nanowires, surrounding or partially surrounding the nanowires with a protective polymer material, depositing a first electrode, removing at least a portion of the protective polymer material to create an internal hollow cavity between the seed layer and the first electrode, and depositing a second electrode. The substrate can have a first side and a second side. The seed layer can be proximate the second side of the substrate. The one or more nanowire pillars can each have a base portion positioned proximate the seed layer and a tip portion extending away from the base portion. The nanowire pillars can be at least partially surrounded with a protective polymer material. The first electrode can be deposited proximate the tip portions of the one or more nanowire pillars. The first electrode can have a first side and a second side. The first side of the first electrode can be proximate the tip portions of the nanowire pillars. The second side of the first electrode can be opposite the first side. At least a portion of the protective polymer material can be removed to create an internal hollow cavity between the seed layer and the first electrode. At least a portion of each of the nanowire pillars can extend through the internal hollow cavity. The second electrode can be deposited proximate the first side of the substrate. The first electrode can be in electrical communication with the second electrode via at least the one or more nanowire pillars.

In some embodiments, the method can further comprise, prior to depositing the seed layer proximate the second side of the substrate, depositing a dielectric layer on the second side of the substrate. In any of the embodiments, the seed layer can be deposited on the dielectric layer.

In some embodiments, the dielectric layer can comprise a metal oxide or nitride selected from the group consisting of titanium dioxide, zirconium dioxide, tin oxide, tin dioxide, aluminum oxide, alumina, silicon dioxide, zinc oxide, indium oxide, hafnium oxide, titanium nitride, aluminum nitride, silicon nitride, hafnium nitride, zirconium nitride, tantalum nitride and combinations thereof.

In some embodiments, the dielectric layer can have a thickness from about 0.1 nm to about 150 nm or more. In some embodiments, the dielectric layer can be deposited using atomic layer deposition (ALD). Other deposition methods can also be used, such as electron-beam evaporation, physical vapor deposition, radio frequency sputtering, direct current sputtering, magnetron sputtering, chemical vapor deposition, spin coating, wet chemical synthesis, hydrothermal growth, and the like.

In some embodiments, the method can further comprise, prior to depositing the first electrode proximate the tip portions of the one or more nanowire pillars, removing a portion of the protective polymer material. The protective polymer material can be removed from any portion of the internal cavity, for example, the protective polymer material proximate the tip portions of the one or more nanowire pillars. The protective polymer material can be removed to expose the tip portions of the one or more nanowire pillars. In some embodiments, the first electrode can be deposited proximate the exposed tip portions of the one or more nanowire pillars and can create the second side of the first electrode, such that the second side of the first electrode can be non-planar.

In some embodiments, the substrate can comprise one of a p-type semiconductor material and an n-type semiconductor material. The one or more nanowire pillars can comprise the other of the p-type semiconducting material and the n-type semiconductor material.

In some embodiments, the p-type semiconductor material can be selected from the group consisting of silicon, boron, gallium, zinc sulfide, copper sulfide, tin (II) sulfide, zinc phosphide, copper tin sulfide, and combinations thereof. The n-type semiconductor material can be selected from the group consisting of zinc oxide, zinc tin oxide, zinc selenide, zinc sulfide, tin oxide, tin dioxide, gallium phosphide, cadmium selenide, cadmium arsenide, titanium dioxide, copper (II) oxide, and combinations thereof.

In some embodiments, the first electrode can comprise a transparent material configured to allow light to pass from an area outside the apparatus, through the first electrode, and into the internal hollow cavity.

These and other aspects of the present disclosure are described in the Detailed Description below and the accompanying drawings. Other aspects and features of embodiments will become apparent to those of ordinary skill in the art upon reviewing the following description of specific, exemplary embodiments in concert with the drawings. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following detailed description of specific embodiments of the disclosure will be better understood when read in conjunction with the appended drawings. For the purpose of illustrating the disclosure, specific embodiments are shown in the drawings. It should be understood, however, that the disclosure is not limited to the precise arrangements and instrumentalities of the embodiments shown in the drawings.

DETAILED DESCRIPTION

Figure 1:
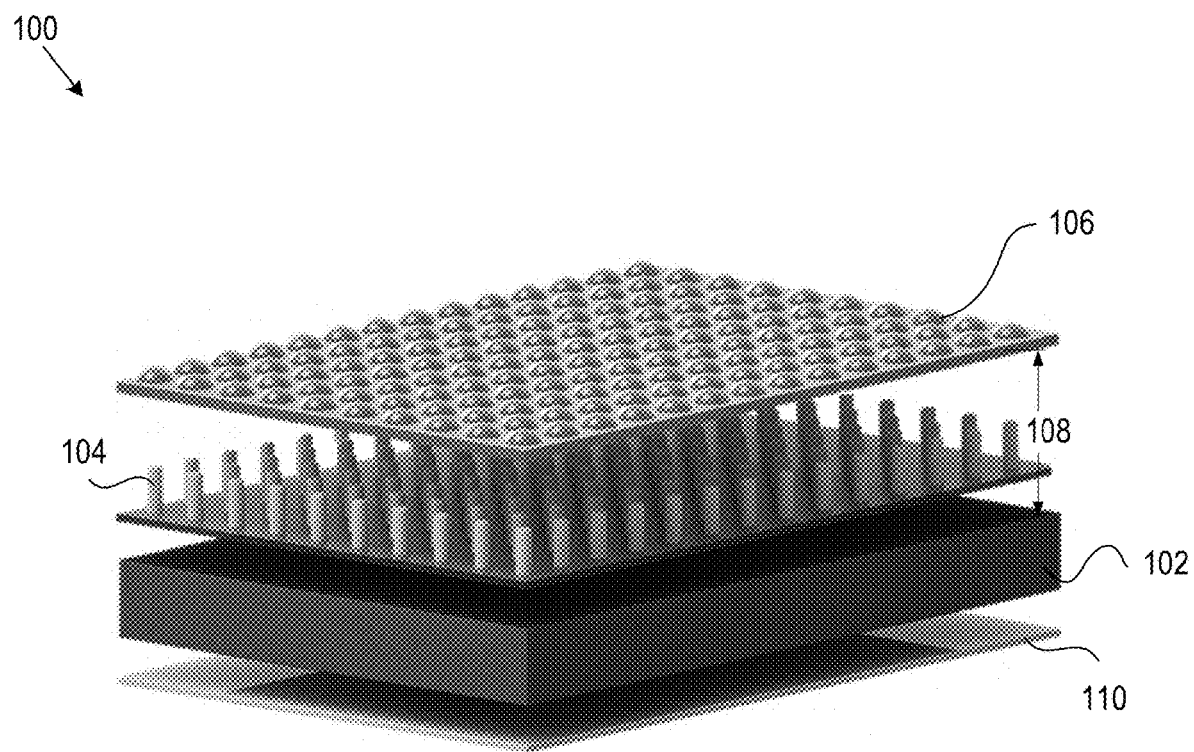
FIG. 1 shows a partially extended view of a piezoelectric device, in accordance with an exemplary embodiment of the present invention.

Although certain embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. Other embodiments of the disclosure are capable of being practiced or carried out in various ways. Also, in describing the embodiments, specific terminology will be resorted to for the sake of clarity. It is intended that each term contemplates its broadest meaning as understood by those skilled in the art and includes all technical equivalents which operate in a similar manner to accomplish a similar purpose.

It should also be noted that, as used in the specification and the appended claims, the singular forms "a," "an" and "the" include plural references unless the context clearly dictates otherwise. References to a composition containing "a" constituent is intended to include other constituents in addition to the one named.

Ranges may be expressed herein as from "about" or "approximately" or "substantially" one particular value and/or to "about" or "approximately" or "substantially" another particular value. When such a range is expressed, other exemplary embodiments include from the one particular value and/or to the other particular value.

Herein, the use of terms such as "having," "has," "including," or "includes" are open-ended and are intended to have the same meaning as terms such as "comprising" or "comprises" and not preclude the presence of other structure, material, or acts. Similarly, though the use of terms such as "can" or "may" are intended to be open-ended and to reflect that structure, material, or acts are not necessary, the failure to use such terms is not intended to reflect that structure, material, or acts are essential. To the extent that structure, material, or acts are presently considered to be essential, they are identified as such.

It is also to be understood that the mention of one or more method steps does not preclude the presence of additional method steps or intervening method steps between those steps expressly identified. Moreover, although the term "step" may be used herein to connote different aspects of methods employed, the term should not be interpreted as implying any particular order among or between various steps herein disclosed unless and except when the order of individual steps is explicitly required. The components described hereinafter as making up various elements of the disclosure are intended to be illustrative and not restrictive. Many suitable components that would perform the same or similar functions as the components described herein are intended to be embraced within the scope of the disclosure. Such other components not described herein can include, but are not limited to, for example, similar components that are developed after development of the presently disclosed subject matter. Additionally, the components described herein may apply to any other component within the disclosure. Merely discussing a feature or component in relation to one embodiment does not preclude the feature or component from being used or associated with another embodiment.

As used herein, the term "layer" refers to a material disposed on at least a portion of an underlying or overlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise.

It should be noted herein that the conductivity of a semiconductor material is indicative of the majority and minority charge carriers in the semiconductor material. For example, an n-type semiconductor material includes "negative charge carriers" as majority charge carriers and "positive charge carriers" as minority charge carriers. For example, a p-type semiconductor material includes "negative charge carriers" as minority charge carriers and "positive charge carriers" as majority charge carriers. As is understood by one of ordinary skilled in the art, "negative charge carriers" refers to electrons whereas "positive charge carriers" refers to holes.

Several features of the present disclosure are defined to be in electrical communication with other features of the present invention. As used herein, element A is in electrical communication with element B if element A and element B are coupled to each other in such a way that electrical current can pass along a communication path from element A to element B or from element B to element A. Further, electrical communication between two elements may be direct or indirect. As used herein, element A is in direct electrical communication with element B if the communication path between element A and element B has an electrical resistance of substantially zero ohms. As used herein, element A is in indirect electrical communication with element B if the communication path between element A and element B has an electrical resistance with a magnitude greater than substantially zero ohms. Moreover, whenever any two features of the present invention are said to be in electrical communication with each other, the two features may by in electrical communication via an electrical connection element. As used herein and as those skilled in the art would recognize, an electrical connection element can be electrical connection elements known in the art or developed at a later time, including but not limited to, an electrical conductor, a combination of electrical components, e.g. resistors, capacitors, inductors, and the like, an electrical circuit, solder, and the like. Further, an electrical connection element can provide direct or indirect electrical communication between two elements.

To facilitate an understanding of the principles and features of the present disclosure, various illustrative embodiments are explained below. The components, steps, and materials described hereinafter as making up various elements of the embodiments disclosed herein are intended to be illustrative and not restrictive. Many suitable components, steps, and materials that would perform the same or similar functions as the components, steps, and materials described herein are intended to be embraced within the scope of the disclosure. Such other components, steps, and materials not described herein can include, but are not limited to, similar components or steps that are developed after development of the embodiments disclosed herein.

Figure 2:
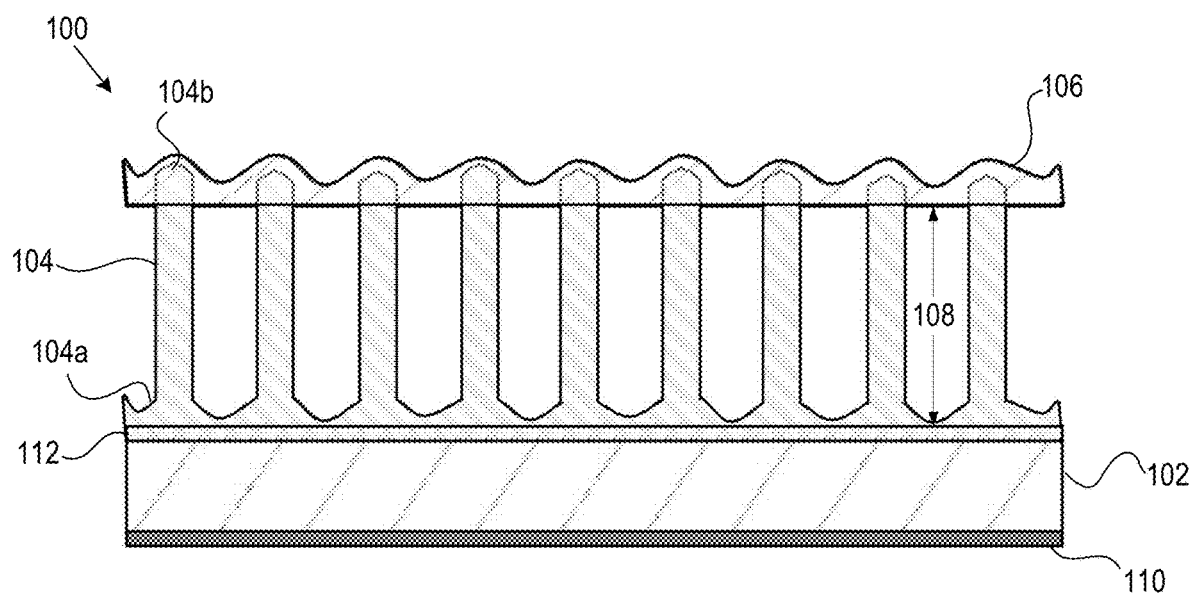
FIG. 2 shows a piezoelectric device, in accordance with an exemplary embodiment of the present invention.

The apparatus herein can have characteristics that optimize performance of the apparatus for a particular application, for example, increased photosensing responsivity and sensitivity for photodiodes, or enhanced charge density for piezo-phototronics. Referring to FIGS. 1 and 2, an exemplary embodiment of the present disclosure provides an apparatus 100 comprising a substrate 102, one or more nanowire pillars 104, a first electrode 106, an internal hollow cavity 108, and a second electrode 110.

In some embodiments, substrate 102 can have a first side and a second side, for example a bottom side and a top side or rear and front. In some embodiments, substrate 102 may be of a geometrical shape having more than two sides such as a pyramid or a polyhedral having more than two sides. In some embodiments, substrate 102 can be flexible, such that substrate 102 can undergo deformation by bending. In some embodiments, substrate 102 can comprise light absorbing material or a semiconductor material, such as an n-type semiconductor material or a p-type semiconductor material. As would be appreciated by those skilled in the art, acceptable p-type semiconductor material can include silicon, boron, gallium, zinc sulfide, copper sulfide, tin (II) sulfide, zinc phosphide, copper tin sulfide, gallium arsenide, gallium nitride and n-type material can be zinc oxide, zinc tin oxide, zinc selenide, zinc sulfide, tin oxide, tin dioxide, gallium phosphide, cadmium selenide, cadmium arsenide, titanium dioxide, copper (II) oxide, zirconate titanate, barium titanate, lead titanate, lead niobate, lithium tantalite, potassium niobate, sodium tungstate, and combinations thereof. In some embodiments, substrate 102 can be a wafer or a thin slice of semiconductor material, such as crystallin silicon. Substrate 102 may have a variety of shapes, thicknesses, and diameters. Additionally, substrate 102 may be doped with varying concentrations of different atoms. As would be appreciated by one of ordinary skill in the art, semiconductor materials can contain doping with silicon, magnesium, manganese, boron, phosphorus, tellurium, zinc, arsenic, antimony and the like.

In some embodiments, apparatus 100 can further comprise one or more nanowire pillars 104. As shown in FIG. 2, each nanowire pillar 104 may have a base portion 104a and a tip portion 104b. Base portion 104a may be positioned proximate one of the sides of substrate 102, for example on the first side or the second side of substrate 102. In some embodiments, base portion 104a may be directly or indirectly in contact with substrate 102. Tip portion 104b may extend away from base portion 104a and substrate 102. In some embodiments, nanowire pillars 104 can be oriented substantially perpendicular to substrate 102. Nanowire pillars 104 may be uniform or non-uniform. As would be appreciated, nanowire pillars 104 can have many lengths, cross-sectional areas, and cross-section areas along the length. For example, in some embodiments, the nanowire pillars 104 can have a length ranging from about 50 nm to about 60 µm and can be smaller or larger. Accordingly, cross-sectional shapes may include, but are not limited to round, square, rectangular, hexagonal, octagonal, pentagonal, oval, triangular, D-shaped, and the like. Cross-sectional lengths may vary from about 10 nm to about 60 µm and can be smaller or larger. In some embodiments, cross-sectional area of nanowire pillars 104 can vary along the length of the nanowire pillar body such that the cross-sectional area at one location along the length of the nanowire pillar body is greater than or lesser than the cross-sectional area at another location along the length of the nanowire pillar body.

Figure 3A:
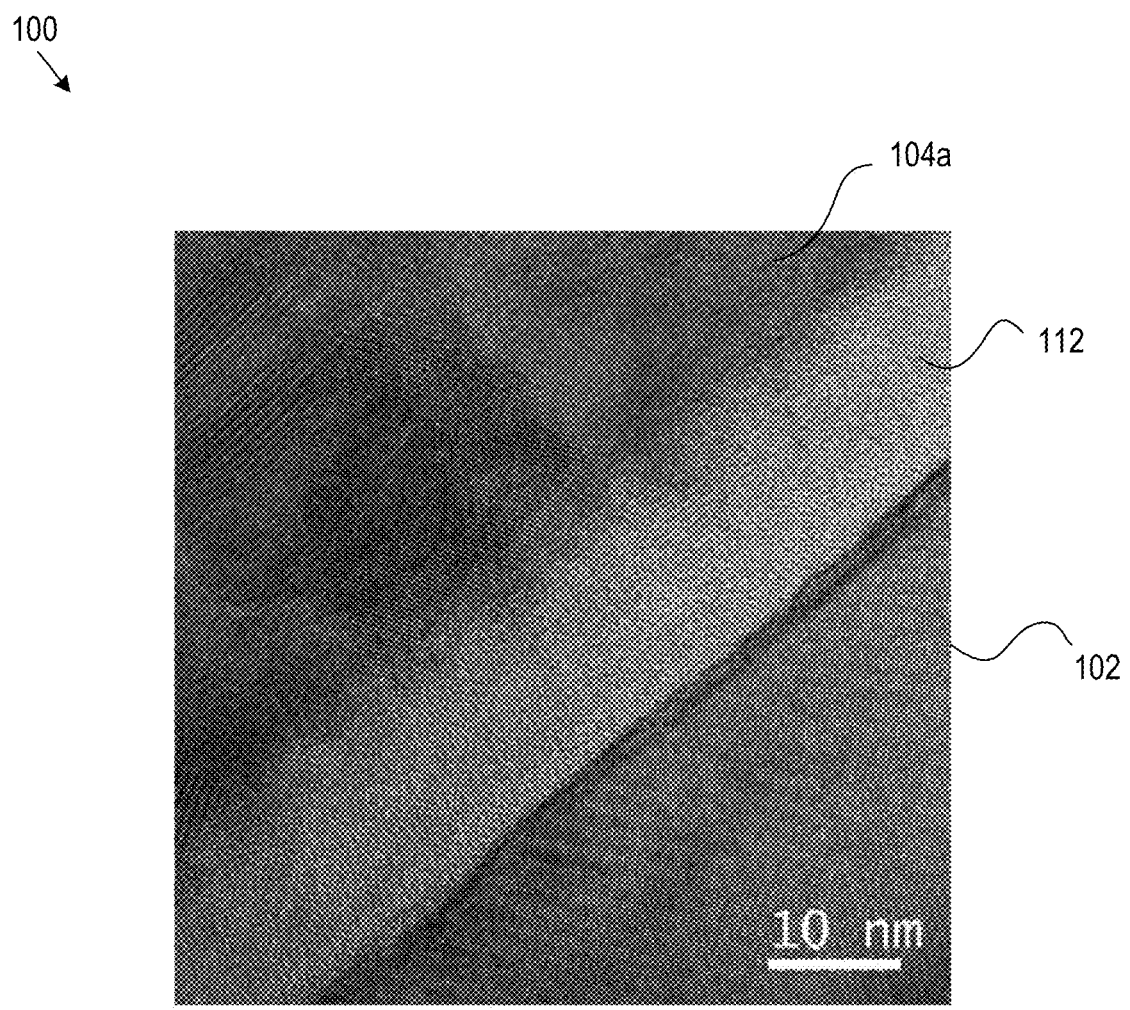
FIG. 3A is a transmission microscope image of a cross section of a piezoelectric device, in accordance with an exemplary embodiment of the present invention.
Figure 3C:
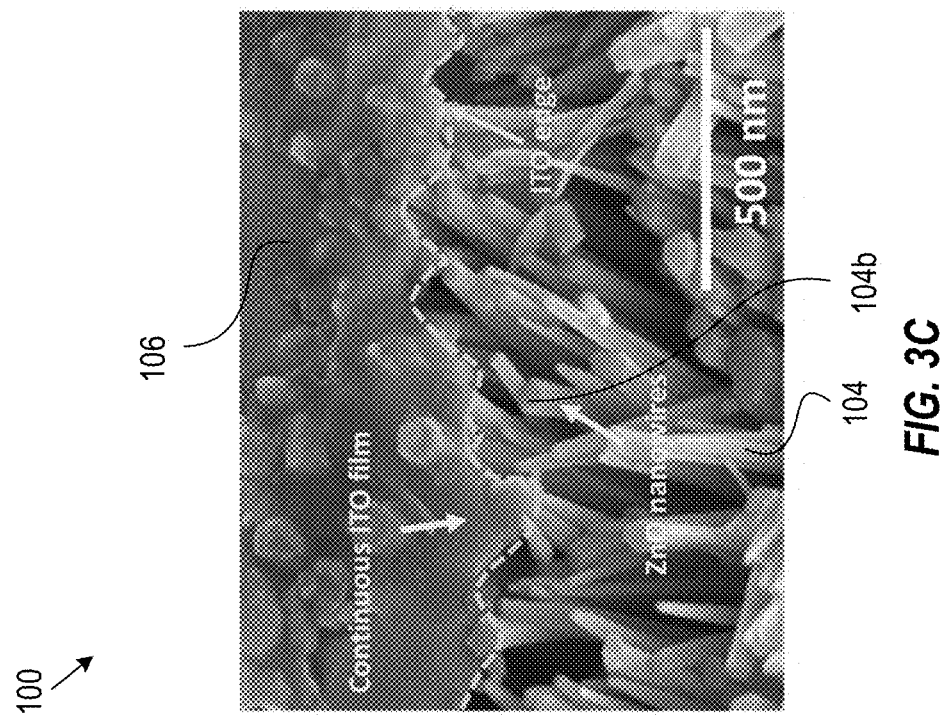
FIGS. 3B and 3C are scanning electron microscope images of a piezoelectric device, in accordance with an exemplary embodiment of the present invention.
Figure 3B:
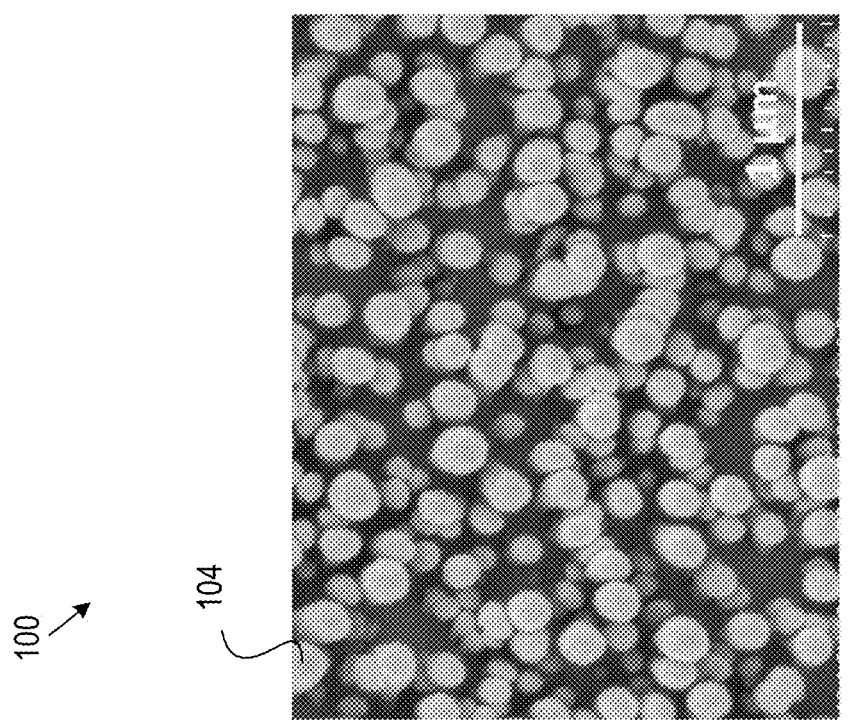

In some embodiments, and as shown in FIGS. 3B and 3C, nanowire pillars 104 can be arranged proximate substrate 102 such that spacing between adjacent nanowire pillars can exist. In some embodiments, nanowire pillars 104 can comprise light absorbing material. Nanowire pillars 104 can be a semiconductor material, such as an n-type semiconductor or a p-type semiconductor. In some embodiments, nanowire pillars 104 can be the same or different semiconductor material as substrate 102. Nanowire pillars 104 can be the one of an n-type semiconductor material or a p-type semiconductor material and substrate 102 can be the other of the n-type semiconductor material or the p-type semiconductor material. For example, nanowire pillars 104 can be an n-type semiconductor material and substrate 102 can be a p-type semiconductor material. As would be appreciated by one of ordinary skill in the art, an n-type semiconductor material in proximity to a p-type semiconductor material can form a p-n junction or interface between the two semiconductor materials. In another example, nanowire pillars 104 can be a p-type semiconductor material and substrate 102 can be an n-type semiconductor material.

In some embodiments, disclosed apparatus 100 can comprise a first electrode 106. First electrode 106 can have a first side and a second side, such as a bottom and top or rear and front. The first side of first electrode 106 can be directly or indirectly in contact with tip portions 104b of nanowire arrays 104. The second side of first electrode 106 can be opposite the first side. In some embodiments, the second side of first electrode 106 can be planar or non-planar. Embodiments include configurations where first electrode 106 can be flexible and transparent. First electrode 106 may include material such as a transparent conductive polymer, transparent conductive oxides, thin-film metals, carbon nanotubes and the like. Acceptable transparent materials include indium tin oxide, fluorine tin oxide, indium zinc oxide, aluminum zinc oxide, indium cadmium oxide, barium stannate, strontium vanadate, calcium vanadate, poly(3,4-ethylenedioxythiophene), poly(styrene sulfonate), poly(4,4-dioctyl cyclopentadithiophene), thin-film silver, thin-film gold, and the like. Additionally, first electrode 106 may be of a suitable conductive metal. Acceptable metals include lithium, beryllium, sodium, magnesium, aluminum, potassium, calcium, scandium, titanium, vanadium, chromium, manganese, iron, cobalt, nickel, copper, zinc, gallium, rubidium, strontium, yttrium, zirconium, niobium, molybdenum, technetium, ruthenium, rhodium, palladium, silver, cadmium, indium, tin, cesium, barium, lanthanum, cerium, hafnium, tantalum, tungsten, rhenium, osmium, iridium, platinum, gold, mercury, thallium, lead, bismuth, and the like.

In some embodiments, apparatus 100 includes an internal hollow cavity 108 positioned between first electrode 106 and substrate 102. Internal hollow cavity 108 can contain at least a portion of nanowire pillars 104. Internal hollow cavity 108 may also contain materials such as gases, liquids, polymers, and the like during the process of making apparatus 100.

Embodiments of apparatus 100 may include a second electrode 110. Second electrode 110 can be proximate at least a portion of one of the sides of substrate 102. In some embodiments, second electrode 110 is in direct or indirect contact with the side of substrate 102 opposite of nanowire pillars 104. Second electrode 110 may be of the same material or different material of first electrode 106. Accordingly, second electrode 110 can be a flexible conductive material, such as a conductive polymer, transparent conductive oxides, thin-film metals, carbon nanotubes and the like. Acceptable metals include lithium, beryllium, sodium, magnesium, aluminum, potassium, calcium, scandium, titanium, vanadium, chromium, manganese, iron, cobalt, nickel, copper, zinc, gallium, rubidium, strontium, yttrium, zirconium, niobium, molybdenum, technetium, ruthenium, rhodium, palladium, silver, cadmium, indium, tin, cesium, barium, lanthanum, cerium, hafnium, tantalum, tungsten, rhenium, osmium, iridium, platinum, gold, mercury, thallium, lead, bismuth, and the like.

In some embodiments, as shown in FIG. 2, apparatus 100 may further comprise a dielectric layer 112. Dielectric layer 112 can be disposed between the one side of substrate 102 and base portions 104a of nanowire pillars 104. Dielectric layer 112 can be disposed on at least a portion of substrate 102. In any of the embodiments, dielectric layer 112 can comprise a material having a thickness from about 0.1 nm to about 150 nm, for example in a single atomic layer or hundreds of atomic layers. An example thickness of dielectric layer 112 can be seen in FIG. 3A. In some embodiments, dielectric layer 112 can be a conformal coating or non-conformal coating. Materials can include at least one metallic element and oxygen, or may consist of essentially at least one metallic element, oxygen, and at least one non-metallic element such as nitrogen. Materials can include metal oxides or nitrides. Suitable metal oxides or nitrides can include, but are not limited to, titanium dioxide, zirconium dioxide, tin oxide, tin dioxide, aluminum oxide, alumina, silicon dioxide, zinc oxide, indium oxide, hafnium oxide, titanium nitride, aluminum nitride, silicon nitride, hafnium nitride, zirconium nitride, tantalum nitride and the like.

As would be appreciated by one of ordinary skill in the art, dielectric layer 112 positioned between substrate 102 of one type of an n-type or p-type semiconductor material and nanowire pillars 104 of one type of an n-type or p-type semiconductor material can create one or more inversion layers between p-n, n-p, n-n, and/or p-p junctions. Dielectric layer 112 can function as one or more inversion layers between substrate 102 and nanowire pillars 104. Dielectric layer 112 can function to ensure that negative charge carriers and/or positive charge carriers do not recombine.

Figure 4A:
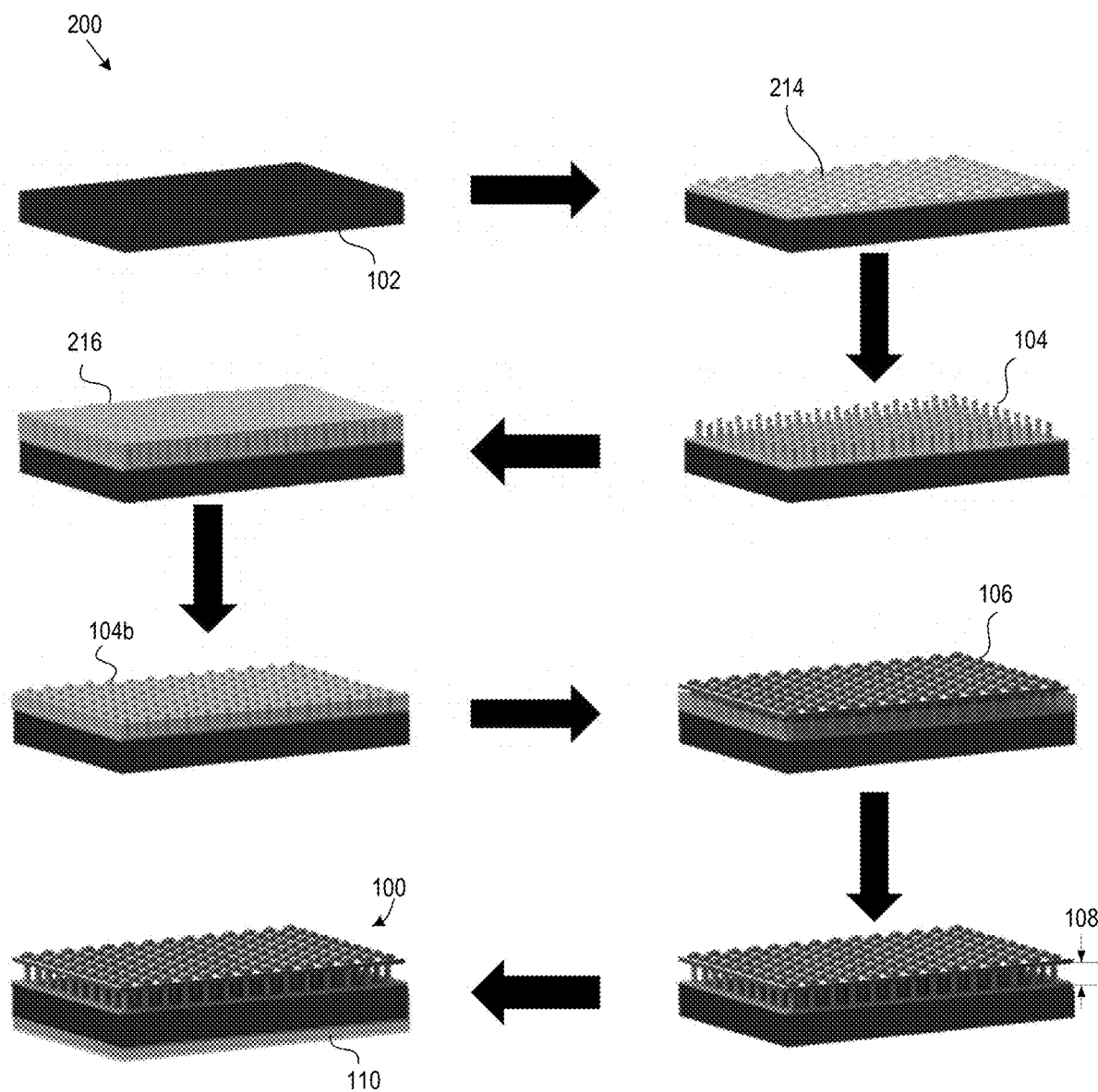
FIGS. 4A and 4B are methods for making a piezoelectric device, in accordance with an exemplary embodiment of the present invention.

As shown in FIG. 4A, some embodiments of the present disclosure provide a method 200 of producing apparatus 100. Method 200 can comprise providing a substrate 102, depositing a seed layer 214, growing one or more nanowires pillars 104, surrounding or partially surrounding nanowire pillars 104 with a protective polymer material 216, depositing a first electrode 106, removing at least a portion of protective polymer material 216 to create an internal hollow cavity 108 between the seed layer 210 and the first electrode 106, and depositing a second electrode 110.

In any of the embodiments, method 200 can comprise depositing seed layer 214 proximate one side of substrate 102. Seed layer 214 may comprise a nanomaterial layer formed of nano-nuclei that may grow into nanostructures, for example, nanowire pillars. Seed layer 214 may be deposited to have a small thickness from about 3 nm to 200 nm but can also have smaller or larger thicknesses. Deposition methods can include spin coating, dip coating, evaporation, RF magnetron sputtering, and other similar methods. Seed layer 214 may comprise the same or different material as nanowire pillars 104. For example, seed layer 214 may be a light absorbing material or a semiconductor material. Seed layer 214 may also include an organic material, an inorganic material, an organic-inorganic composite, or other suitable material.

In some embodiments, method 200 can comprise growing one or more nanowire pillars 104 from seed layer 214. Nanowire pillars 104 may be grown from nano-nuclei within seed layer 214 by immersing substrate 102 having seed layer 214 into a solution comprising nanomaterial, such as dissolved nanomaterial or dissolved precursor materials for forming nanostructures. In some embodiments, nanowire pillars 104 may be grown vertically from seed layer 214 and can comprise base portions 104a and tip portions 104b.

In some embodiments, method 200 can comprise surrounding or partially surrounding nanowire pillars 104 with protective polymer material 216. Protective polymer material 216 may surround nanowire pillars 104 from base portion 104a to tip portion 104b and can cover over tip portion 104 or may only partially surround nanowire pillars 104 with voids anywhere along the length of nanowire pillars 104. Protective polymer material 216 can include a poly(methyl methacrylate) (PMMA), polystyrene (PS), polyvinylpyrrolidone (PVP), poly(perfluoro-butenylvinyl ether), poly(2,5-bis(3-hexadecylthiophen-2-yl)thieno[3,2-b]thiophene (PBTTT), and other polymers with similar properties. Deposition methods can include spin coating, dip coating, evaporation, RF magnetron sputtering, and other similar methods.

In some embodiments, first electrode 106 may be deposited on protective polymer material 216 surrounding or encompassing nanowire pillars 104. In some embodiments, protective polymer material 216 may not surround or encompass tip portion 104b of each nanowire pillar 104 and first electrode 106 may be deposited directly on tip portions 104b of nanowire pillars 104.

In some embodiments, method 200 can comprise removing at least a portion of protective polymer material 216 after depositing first electrode 106 proximate to tip portions 104b of nanowire pillars 104. As would be appreciated by one skilled in the art, removing at least a portion of protective polymer material 216 can create internal hollow cavity 108 between substrate 102 and first electrode 106 while leaving nanowire pillars 104 intact within internal hollow cavity 108. Methods of removing protective polymer material 216 can depend on the type of polymer material used. For example, when using PMMA as protective polymer material 216, organic solvents, for example, acetone, toluene, dichloromethane, chloroform, and the like can be used to partially or fully remove or dissolve PMMA. PMMA may also be partially or fully removed by etching, wet etching, polishing, dissolving, and the like.

Figure 4B:
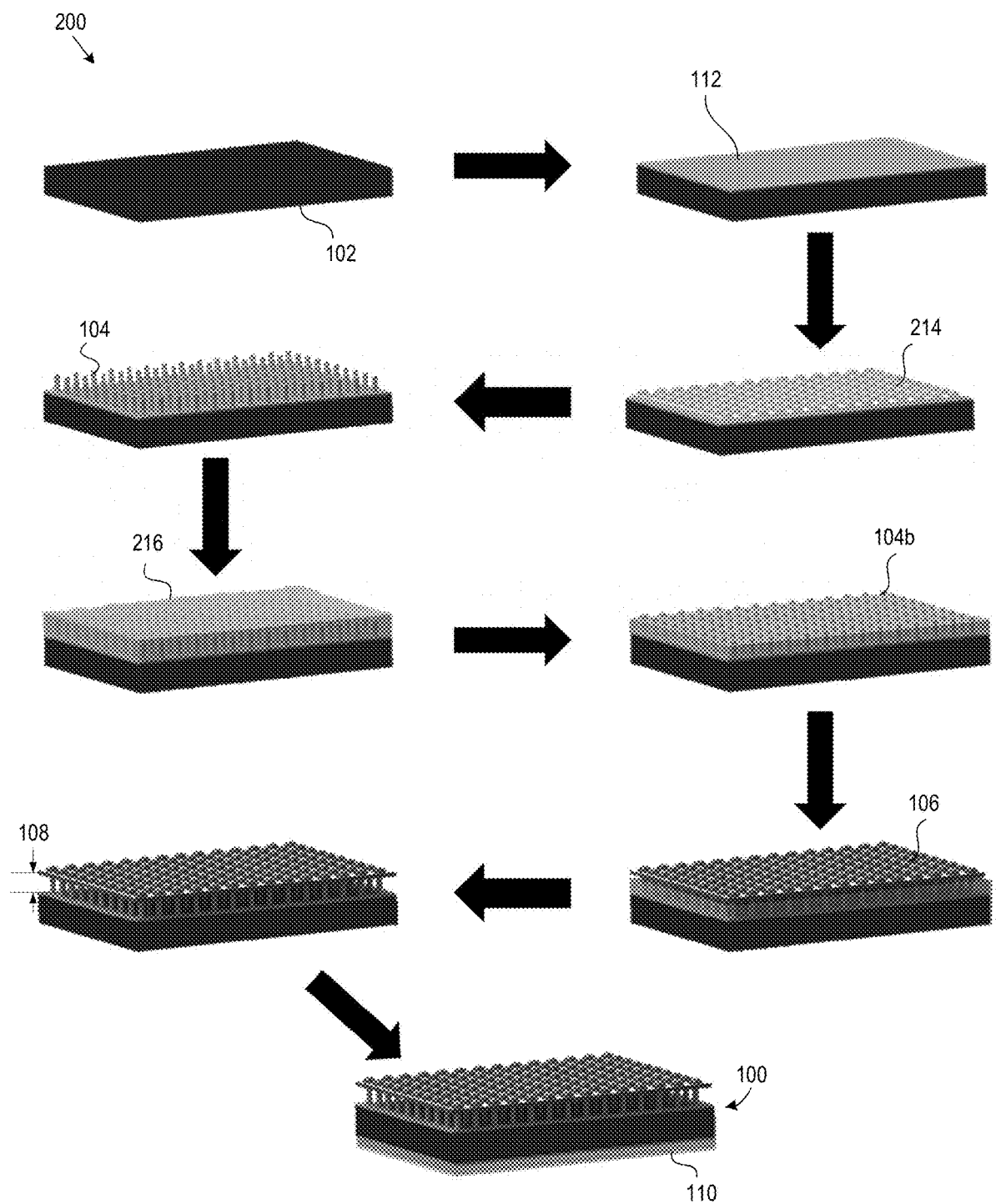
Figure 5:
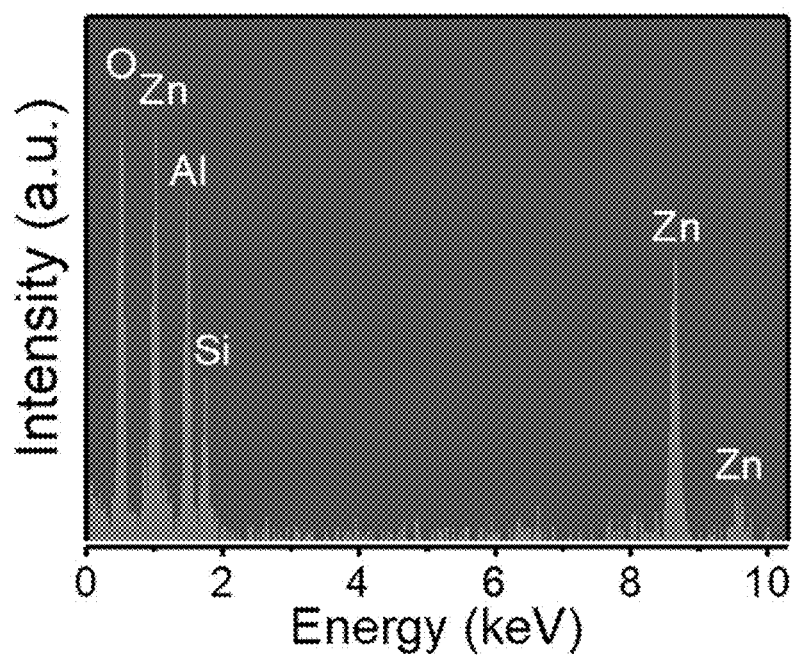
FIG. 5 shows a plot of energy (keV) versus intensity (a.u.), in accordance with an exemplary embodiment of the present invention.
Figure 6:
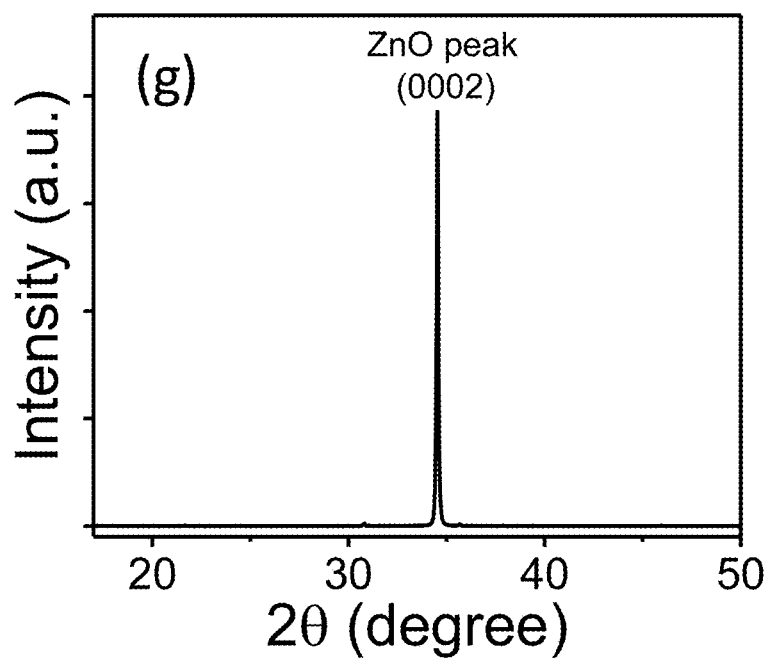
FIG. 6 shows a plot of 20 (degree) versus intensity (a.u.), in accordance with an exemplary embodiment of the present invention.
Figure 7:
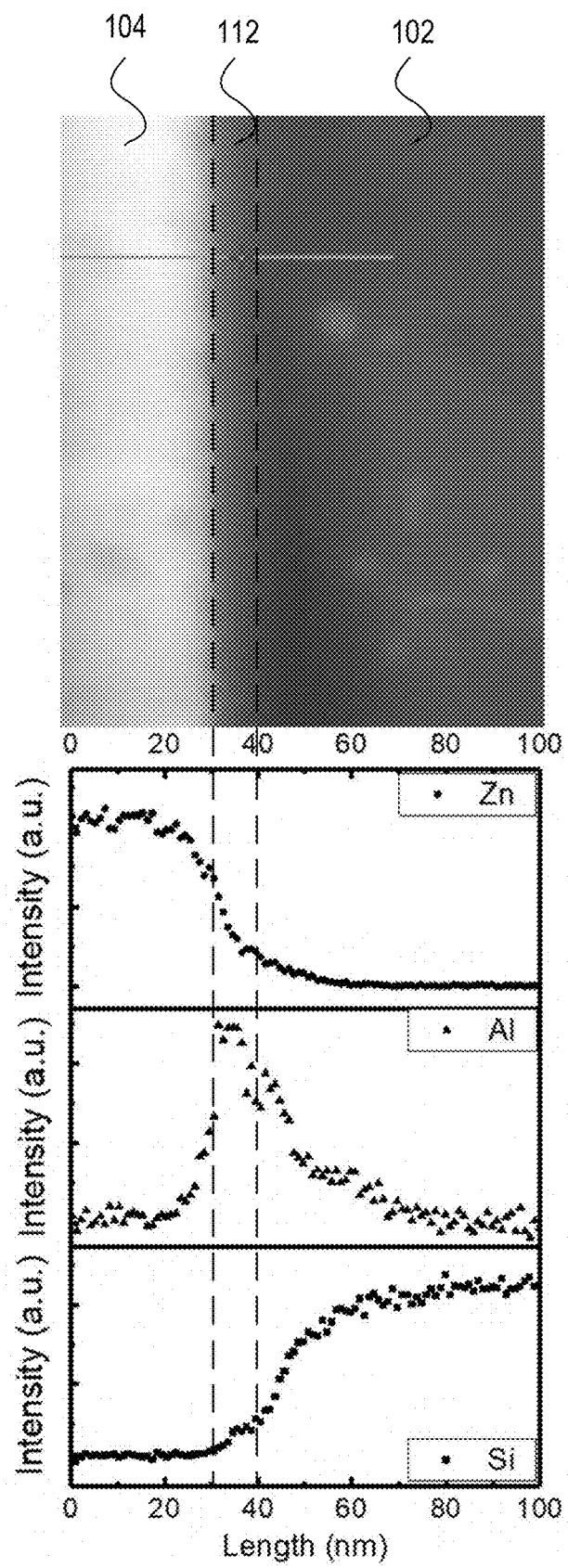
FIG. 7 shows a scanning electron microscope image and an energy-dispersive X-ray line scan plot of line length (nm) versus intensity (a.u.), in accordance with an exemplary embodiment of the present invention.
Figure 8:
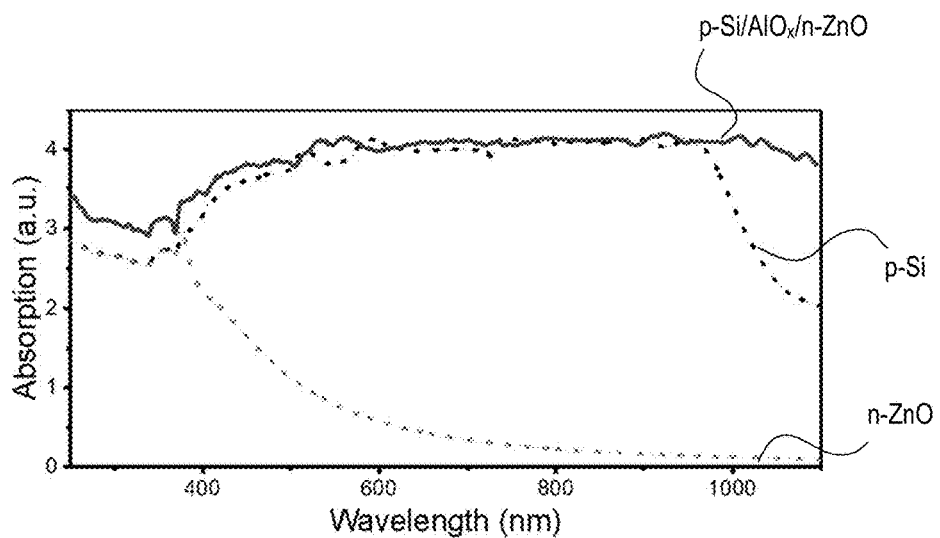
FIG. 8 shows a plot of wavelength (nm) versus absorption (a.u.), in accordance with an exemplary embodiment of the present invention.
Figure 9:
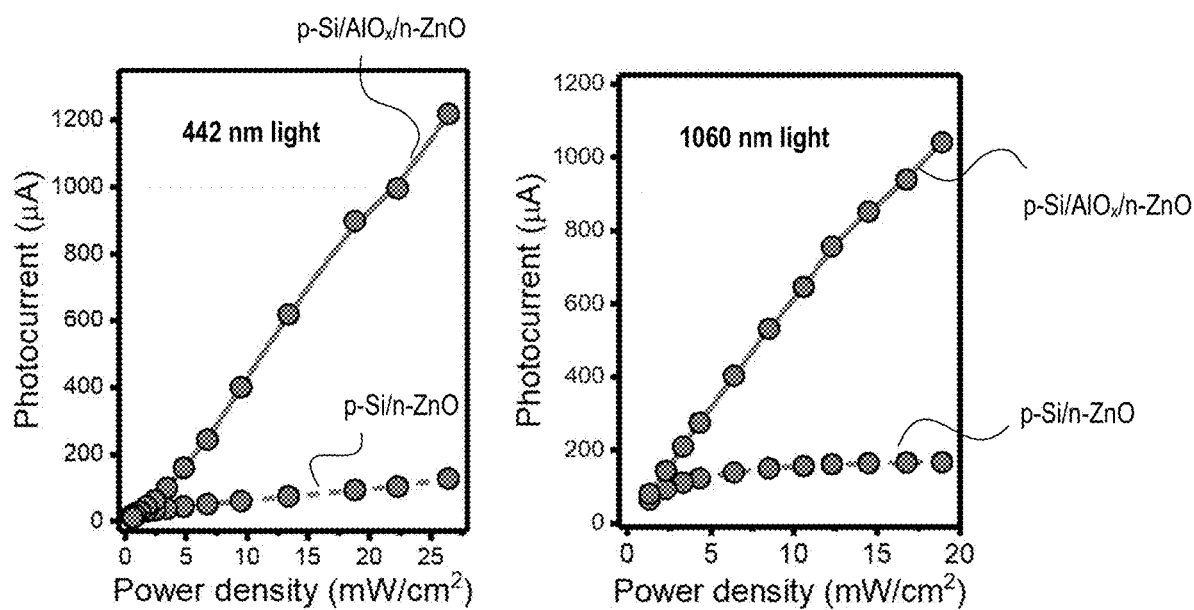
FIG. 9 shows plots of power density ($mW/cm^2$) versus photocurrent ($\mu A$), in accordance with an exemplary embodiment of the present invention.
Figure 10:
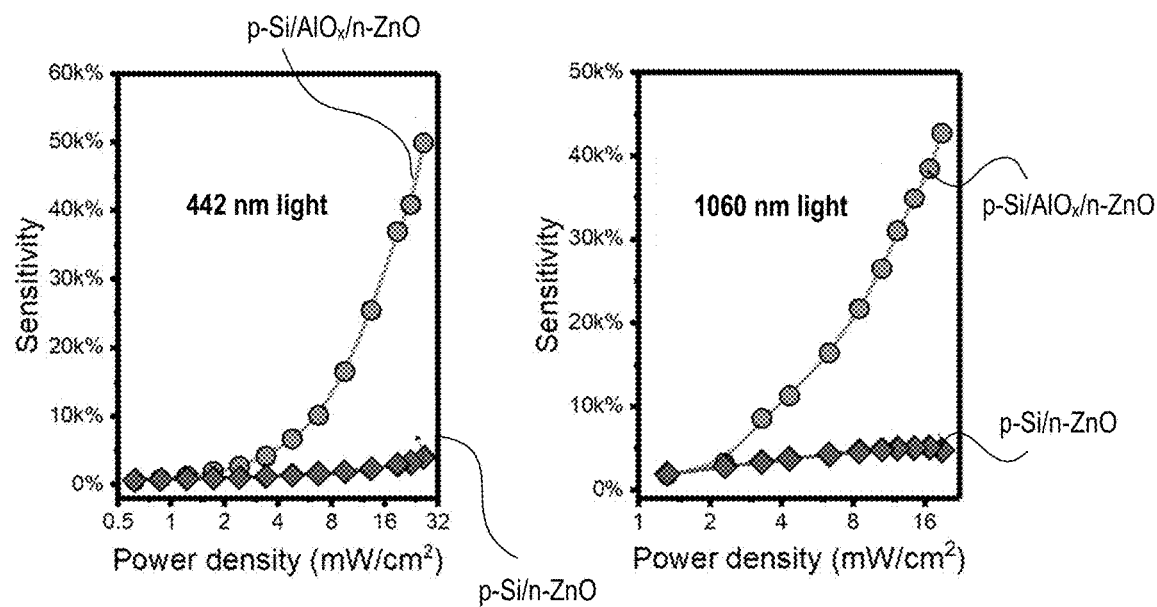
FIG. 10 shows plots of power density ($mW/cm^2$) versus sensitivity (%), in accordance with an exemplary embodiment of the present invention.
Figure 11:
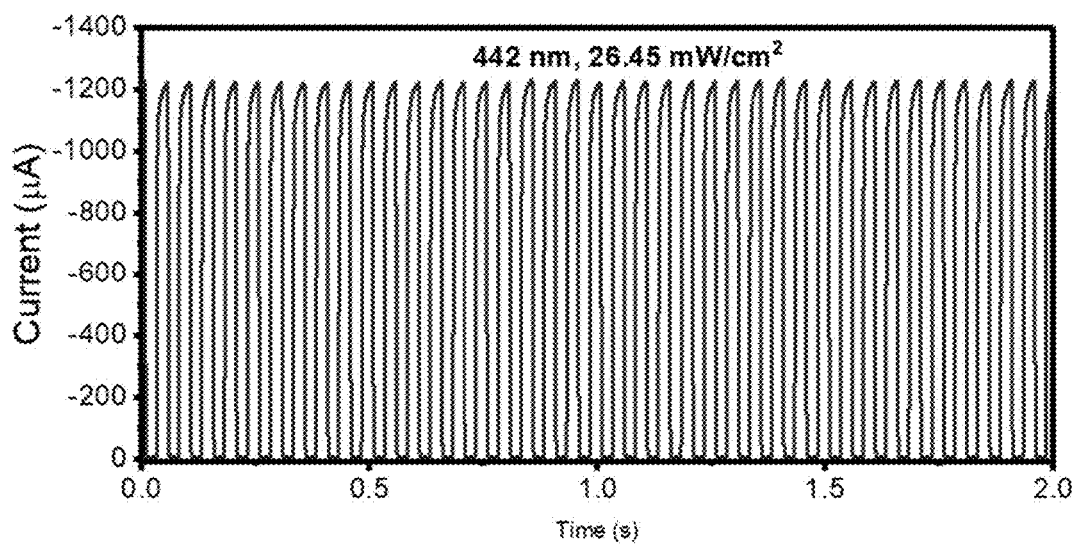
FIG. 11 shows a plot of time (s) versus current ($\mu A$), in accordance with an exemplary embodiment of the present invention.
Figure 12:
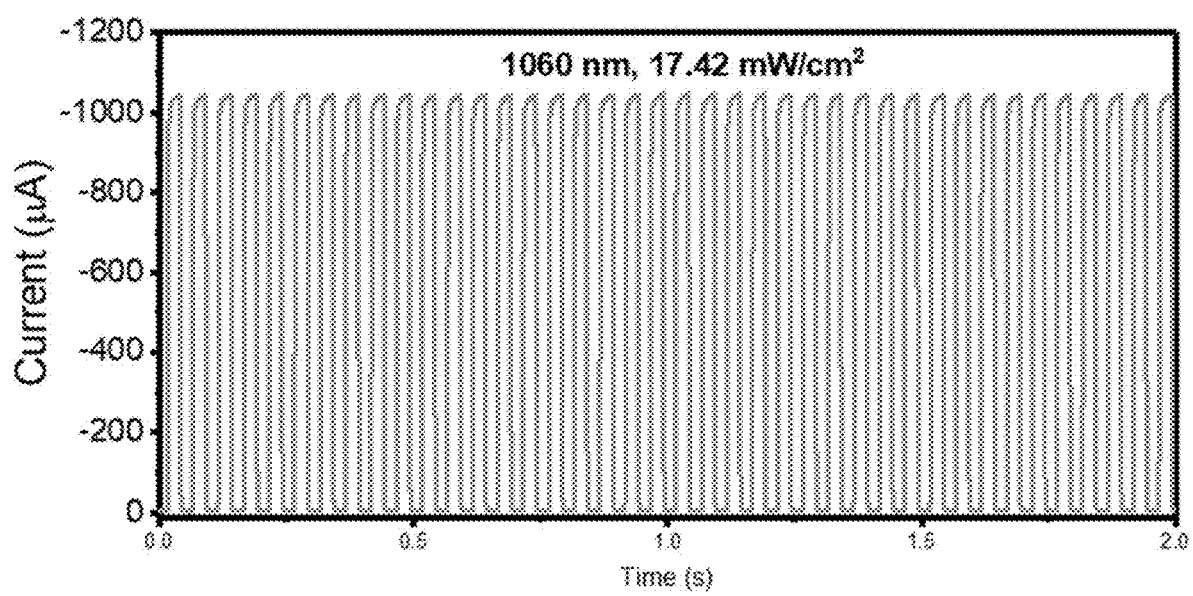
FIG. 12 shows a plot of time (s) versus current ($\mu A$), in accordance with an exemplary embodiment of the present invention.
Figure 13:
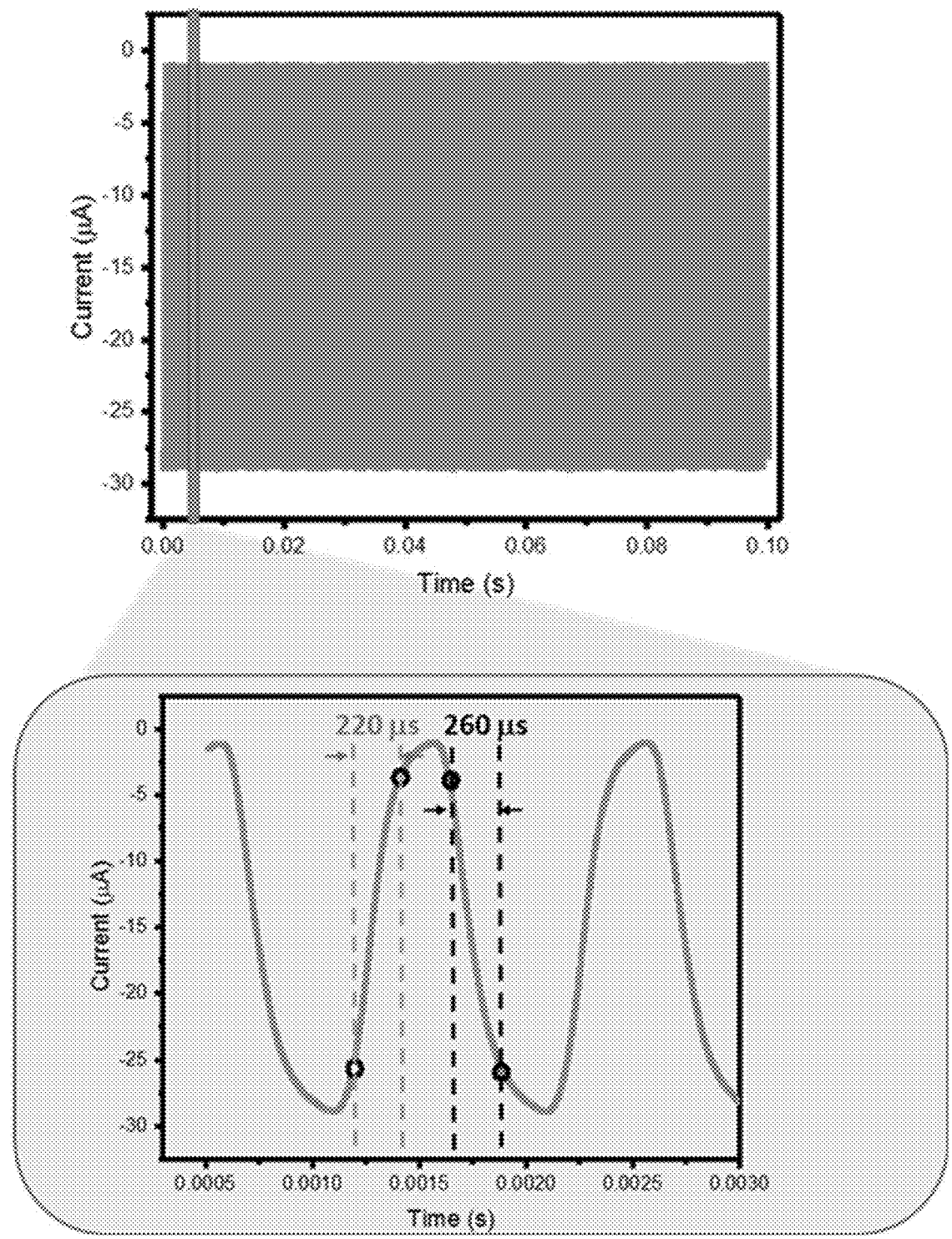
FIG. 13 shows plots of time (s) versus current ($\mu A$), in accordance with an exemplary embodiment of the present invention.

As shown in FIGS. 4A and 4b, some embodiments of method 200 can comprise removing at least a portion of protective polymer material 216 prior to depositing first electrode 106. In such an example, removing at least a portion of protective polymer material 216 proximate tip portions 104b of nanowire pillars 104 exposes one or more tip portions 104b, while keeping some or most of nanowire pillars 104 surrounded by protective polymer material 216. In some embodiments, depositing first electrode 106 over exposed tip portions 104b of nanowire pillars 104 can create one side of first electrode 106 that is non-planar or textured. As shown in FIG. 3C, an external-facing surface of first electrode 106 is non-planar. One skilled in the art would recognize that a non-planar or textured surface may function as an antireflection layer and may improve absorption of light over a wide wavelength range from near-ultraviolet to near-infrared.

In any of the embodiments, method 200 can also comprise depositing second electrode 110 on one side of substrate 102. In some embodiments, second electrode 110 can be deposited on substrate 102 side opposite of seed layer 214 or nanowire pillars 214. Second electrode 119 can be of the same or different material as first electrode 106.

In some embodiments, first electrode 106 can be in electrical communication with second electrode 110 via at least one or more nanowire pillars 104.

In some embodiments, as shown in FIG. 4B, method 200 can further comprise depositing dielectric layer 112 on one side of substrate 102 prior to depositing seed layer 214. Seed layer 214 can be deposited on dielectric layer 112. As described above, dielectric layer 112 can have a thickness from about 0.1 nm to about 150 nm, for example in a single atomic layer or hundreds of atomic layers. Dielectric layer 112 can be deposited on one side of substrate 102 by a conformal deposition method, for example, by chemical vapor deposition (CVD), atomic layer deposition (ALD), low pressure chemical vapor deposition (LPCVD), pulsed laser deposition (PLD), liquid source misted chemical deposition, spin coating, electron-beam evaporation, physical vapor deposition, radio frequency sputtering, direct current sputtering, magnetron sputtering, wet chemical synthesis, hydrothermal growth, or combinations thereof.

The following examples further illustrate aspects of the present disclosure. However, they are in no way a limitation of the teachings or disclosure of the present disclosure as set forth herein.

EXAMPLES

The following examples are provided by way of illustration but not by way of limitation.

Example 1

Materials and Methods

Broadband photodiode based on p-Si/AlO$_x$/n-ZnO nanowire (NW) arrays was fabricated by first coating the surface of the p-Si with a 15-nm thick atomic layer deposited (ALD) alumina (AlO$_x$). Uniform ZnO NWs 70-80 nm in diameter and 2 μm in length were grown vertically on the AlO$_x$ layer. A NIR antireflection layer of indium tin oxide (ITO) top electrode was only developed at the tips of the NWs. The rear side of the wafer was coated with aluminum as the bottom electrode.

Fabrication Process of the p-Si/Al$_2$O$_3$/n-ZnO photodetector: Each device had a size of 1 cm×1 cm sliced from a p-type Si wafer (100 mm, B-doped, 1-10 Ω-cm resistivity, <100> orientation, 500 μm thickness, from UniversityWafer Inc.) was washed in an ultrasonicator with acetone, isopropyl alcohol, and distilled water each for 20 minutes. AlO$_x$ layer of 15 nm thickness was coated on the samples in a Cambridge NanoTech Plasma ALD chamber for 150 cycles. ZnO seedlayer (~50-70 nm) was deposited by RF magnetron sputtering (PVD RF75, Kurt. J. Lesker Company) with a thickness about 100 nm. The coated p-Si wafer was then placed into a mixed growth solution (25 mM Zn(NO$_3$)$_2$, 12.5 mM hexamethylenetetramine, and 0.8 M ammonium hydroxide) in a mechanical convection oven (Yamato DKN400, Santa Clara, Calif., USA) at 95° C. for 90 minutes. The samples was subsequently washed with isopropyl alcohol and distilled water and dried in the oven at 60° C. for an hour. PMMA (MicroChem 495PMMA A8) was spun-coated onto the samples Spin-coat at 500 rpm for 5 seconds, and then 2000 rpm for 30 seconds, and cured at 180° C. for 20 minutes. The samples were treated with oxygen plasma in Vision RIE for 4 minutes to expose the tips of ZnO nanowires. A thin layer of ITO was deposited on ZnO as the top electrode and Al was deposited on the rear side of the p-Si wafer as the bottom electrode. The samples were then cleaned by acetone to remove the PMMA layer and annealed at 350° C. for 2 hours in a compact rapid thermal processing tube furnace (RTP-1000D4, MTI Corporation). Bottom electrode contact was formed by depositing 200 nm Al by electron beam evaporation as the bottom electrode. Testing wires were connected to the electrodes by silver paste.

Example 2

Materials and Methods

The devices based on p-Si/AlO$_x$/metal was fabricated following the same procedure described above, where an aluminum layer was deposited at the rear side of p-Si as the back electrode and the ITO was deposited at the surface of AlO$_x$. For the devices based on metal/AlO$_x$/n-ZnO NW arrays, the AlO$_x$ was deposited on a p++-Si substrate (Universitywafer, Inc., 0.001-0.005 Ohm·cm) that was subsequently used as the conductive electrode (i.e. metal). The suspended top ceiling ITO antireflection electrode was deposited in the same way as described above.

Example 3

Materials Characterizations

Detailed microscopic structures of ZnO NWs were characterized by scanning electron microscope (Hitachi SU 8010).

Measurements: A piece of sapphire was fixed on the sample holder by layers of double-adhesive Kapton tape. The sample was then settled on the sapphire by the Kapton tape. External strains were applied onto the sample by pressing the surface of the device through another piece of sapphire (Fig. S8, Supporting Information) with a 3D mechanical stage (movement resolution≈10 μm). The device was fixed onto the through double-sided Kapton polyimide tape. Transmission and absorption spectra of materials were measured by a UV-vis spectrophotometer (JASCO V-630).

Current versus voltage (I-V) characteristics of the devices were measured and recorded by a computer-controlled measurement system with a Stanford SRS low noise current preamplifier (SR570)/SRS low noise voltage preamplifier (SR560) in conjunction with a GPIB controller (GPIB-USB-HS, NI 488.2). The optical input stimuli were provided by a He—Cd laser (wavelength=442 nm, model no. KI5751I-G, Kimmon Koha Co., Ltd.). A continuously variable filter was used to control the light power density, which was measured by a thermopile power meter (Newport 818P-001-12). The capacitance versus voltage (C-V) measurements were carried out with a Keithley 4200 at 1 MHz.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way.

What is claimed is:

1. An apparatus comprising:
    a dielectric layer having a first side and a second side, and positioned proximate a substrate;
    nanowire pillars, each comprising:
        a base portion positioned proximate the second side of the dielectric layer; and
        a tip portion extending away from the base portion;
    a first electrode having a first side and a second side, the first side being planar and positioned proximate to the tip portions of the nanowire pillars and the second side being non-planar; and
    an internal hollow cavity positioned between the second side of the dielectric layer and the first side of the first electrode, such that at least a portion of the nanowire pillars extend through the internal hollow cavity.

2. The apparatus of claim 1 further comprising a protective polymer material at least partially surrounding the nanowire pillars;
    wherein each nanowire pillar is oriented substantially perpendicular to the dielectric layer.

3. The apparatus of claim 2 further comprising:
    the substrate having a first side and a second side positioned proximate the first side of the dielectric layer; and
    a second electrode having a first side and a second side positioned proximate the first side of the substrate;
    wherein the second side of the first electrode is textured; and
    wherein each nanowire pillar comprises one of an n-type semiconductor material or a p-type semiconductor material.

4. The apparatus of claim 3, wherein the substrate comprises one of an n-type semiconductor material or a p-type semiconductor material.

5. The apparatus of claim 4, wherein the p-type semiconductor material is selected from the group consisting of silicon, boron, gallium, zinc sulfide, copper sulfide, tin (II) sulfide, zinc phosphide, copper tin sulfide, and combinations thereof, and
    wherein the n-type material is selected from the group consisting of zinc oxide, zinc tin oxide, zinc selenide, zinc sulfide, tin oxide, tin dioxide, gallium phosphide, cadmium selenide, cadmium arsenide, titanium dioxide, copper (II) oxide, zirconate titanate, barium titanate, lead titanate, lead niobate, lithium tantalite, potassium niobate, sodium tungstate, and combinations thereof.

6. The apparatus of claim 3, wherein at least a portion of the second side of the substrate is covered with the dielectric layer.

7. The apparatus of claim 1, wherein the dielectric layer comprises a metal oxide or nitride selected from the group consisting of titanium dioxide, zirconium dioxide, tin oxide, tin dioxide, aluminum oxide, alumina, silicon dioxide, zinc oxide, indium oxide, hafnium oxide, titanium nitride, aluminum nitride, silicon nitride, hafnium nitride, zirconium nitride, tantalum nitride and combinations thereof.

8. The apparatus of claim 1, wherein the first electrode comprises a transparent material configured to allow light to pass from the second side of the first electrode, through the first electrode, and into the internal hollow cavity.

9. The apparatus of claim 8, wherein the transparent material is selected from the group consisting of indium tin oxide, fluorine tin oxide, indium zinc oxide, aluminum zinc oxide, indium cadmium oxide, barium stannate, strontium vanadate, calcium vanadate, poly(3,4-ethylenedioxythiophene), poly(styrene sulfonate), poly(4,4-dioctyl cyclopentadithiophene), thin-film silver, thin-film gold, and combinations thereof.

10. An apparatus comprising:
    a substrate comprising semiconductor material having a first side and a second side;
    a dielectric layer having a first side and a second side positioned proximate the substrate;
    nanowire pillars comprising semiconductor material, each comprising:
        a base portion positioned proximate the second side of the dielectric layer; and
        a tip portion extending away from the base portion;
    a protective polymer material at least partially surrounding the nanowire pillars;
    a first electrode having a first side and a second side, the first side being planar and positioned proximate to the tip portions of the nanowire pillars and the second side being textured; and
    an internal hollow cavity positioned between the second side of the dielectric layer and the first side of the first electrode, such that at least a portion of the nanowire pillars extend through the internal hollow cavity.

11. The apparatus of claim 10 further comprising a seed layer having a first side and a second side, the first side positioned proximate the second side of the dielectric layer, and the second side positioned proximate the base portions of the nanowire pillars.

12. The apparatus of claim 10 further comprising a second electrode having a first side and a second side positioned proximate the first side of the substrate;
wherein the first electrode is in electrical communication with the second electrode via one or more of the nanowire pillars.

13. A method of producing an apparatus comprising:
depositing a seed layer proximate a second side of a substrate having a first side and the second side;
growing one or more nanowire pillars, wherein one or more of the nanowire pillars have a base portion positioned proximate the seed layer and a tip portion extending away from the base portion;
at least partially surrounding one or more of the nanowire pillars with a protective polymer material;
depositing a first electrode proximate the tip portions of one or more of the nanowire pillars, the first electrode having a first side and a second side, the first side proximate the tip portions; and
removing at a least a portion of the protective polymer material to create an internal hollow cavity between the seed layer and the first electrode, such that at least a portion of one or more of the nanowire pillars extends through the internal hollow cavity.

14. The method of claim 13 further comprising:
prior to depositing the seed layer proximate the second side of the substrate, depositing a dielectric layer on the second side of the substrate; and
depositing a second electrode proximate the first side of the substrate, such that the first electrode is in electrical communication with the second electrode via one or more of the nanowire pillars.

15. The method of claim 14, wherein the dielectric layer comprises a metal oxide or nitride selected from the group consisting of titanium dioxide, zirconium dioxide, tin oxide, tin dioxide, aluminum oxide, alumina, silicon dioxide, zinc oxide, indium oxide, hafnium oxide, titanium nitride, aluminum nitride, silicon nitride, hafnium nitride, zirconium nitride, tantalum nitride and combinations thereof.

16. The method of claim 14, wherein the dielectric layer has a thickness from about 0.1 nm to about 150 nm.

17. The method of claim 13 further comprising:
prior to depositing the first electrode, removing a portion of the protective polymer material proximate the tip portion of one or more of the nanowire pillars to expose the tip portion;
wherein depositing the first electrode creates the second side of the first electrode, such that the second side of the first electrode is non-planar.

18. The method of claim 13 further comprising the substrate;
wherein the substrate comprises a p-type semiconductor material or an n-type semiconductor material, wherein the one or more nanowire pillars comprise a p-type semiconducting material or an n-type semiconductor material.

19. The method of claim 18, wherein the p-type semiconductor material is selected from the group consisting of silicon, boron, gallium, zinc sulfide, copper sulfide, tin (II) sulfide, zinc phosphide, copper tin sulfide, and combinations thereof; and
wherein the n-type semiconductor material is selected from the group consisting of zinc oxide, zinc tin oxide, zinc selenide, zinc sulfide, tin oxide, tin dioxide, gallium phosphide, cadmium selenide, cadmium arsenide, titanium dioxide, copper (II) oxide, and combinations thereof.

20. The method of claim 13, wherein the first electrode comprises a transparent material configured to allow light to pass from an area outside the apparatus, through the first electrode, and into the internal hollow cavity.

* * * * *